United States Patent [19]

Ishigaki et al.

[11] 3,855,551

[45] Dec. 17, 1974

[54] MULTIVIBRATOR CIRCUIT

[75] Inventors: Yoshio Ishigaki; Masayuki Hongu, both of Tokyo, Japan

[73] Assignee: Sony Corporation, Tokyo, Japan

[22] Filed: Dec. 14, 1973

[21] Appl. No.: 424,782

[30] Foreign Application Priority Data

Dec. 22, 1972 Japan ............................ 47-129099

[52] U.S. Cl. ............................... 331/113 R, 332/14

[51] Int. Cl. ............................................ H03k 3/282

[58] Field of Search ......................... 331/113; 332/14

[56] References Cited

UNITED STATES PATENTS

| | | | |
|---|---|---|---|
| 3,037,172 | 5/1962 | Biard | 331/113 |
| 3,061,799 | 10/1962 | Biard | 331/113 |
| 3,249,893 | 5/1966 | Castellano, Jr. | 331/113 |
| 3,349,343 | 10/1967 | Luna et al. | 331/113 |
| 3,371,289 | 2/1968 | Luna et al. | 331/113 |
| 3,566,301 | 2/1971 | Grangaard, Jr. | 331/113 |
| 3,582,809 | 6/1971 | Rigby | 331/113 |
| 3,811,097 | 5/1974 | Dijkmans | 331/113 |

*Primary Examiner*—John Kominski
*Attorney, Agent, or Firm*—Lewis H. Eslinger; Alvin Sinderbrand

[57] ABSTRACT

An emitter coupled multivibrator circuit including a pair of transistors and having a stabilized duty ratio of the output pulse. The multivibrator may be integrated into a single monolithic block. Emitter electrodes of the above pair of transistors in the multivibrator circuit are connected to a common constant current source through a pair of current controlling transistors respectively. The base electrodes of the current controlling transistors are connected to the output terminals of the multivibrator respectively. A frequency modulator or a frequency demodulator in which the multivibrator with a constant duty ratio of the output pulse is applied is provided without any interference such as the higher harmonics of a carrier frequency.

10 Claims, 7 Drawing Figures

MULTIVIBRATOR CIRCUIT

BACKGROUND OF THE INVENTION

1. Field of the Invention

The present invention relates generally to multivibrator circuits that are useful as frequency modulators or demodulators and more particularly to a multivibrator circuit in which the duty ratio of the output pulse is stabilized.

2. Description of the Prior Art

In the prior art an emitter coupled multivibrator circuit including transistors is employed as an oscillatory element which is useful as a frequency modulator or frequency demodulator circuit, for example. In the emitter-coupled multivibrator, a capacitor is connected between the emitter electrodes of two transistors and the base electrodes of these two transistors are connected to the collector electrodes thereof through the emitter follower transistors, respectively. In operation, the two transistors alternately conduct to generate the oscillations of the circuit. The voltage at the emitter of the transistor which is not conducting is dependent upon the voltage across the capacitor intercoupling the two emitter electrodes, and the charge stored on this capacitor is continuously changing as a result of the flow of a portion of the current from the conducting transistor. When the voltage at the emitter of the nonconducting transistor reaches that at the base electrode, this transistor starts conducting. Due to regenerative action through the base-emitter-collector circuit of the transistors, the previously conducting transistor then stops conducting and the previously nonconducting transistor conducts fully. The charge stored on the capacitor then starts to change in the opposite direction. This action continues until the charge is sufficiently changed to cause the potential at the emitter electrode of the now nonconducting transistor to equal that at the base electrode.

The frequency of the circuit is determined by the charging time and discharging of the capacitor, and a frequency modulator may be developed by varying the charging or discharging time of the capacitor as a function of an input voltage. The emitter electrodes of the two coupled transistors are connected to normally constant current sources respectively, which are adapted to be adjusted in accordance with an input signal.

In this manner, the charging current of the capacitor is a value which can be varied in accordance with the input signal. As a result of this control of charging current during one state of conduction of the multivibrator, the duration of one complete cycle is variable, and therefore the frequency is variable.

In this circuit, when a modulating signal is applied to the base electrode of the constant current source transistors, the current through the constant current source is varied, and therefore a frequency modulated signal is produced.

By way of example, in the case of a VTR, the luminance signal is used as an input signal or the modulating signal and the luminance signal subjected to frequency modulation is recorded on a magnetic tape.

In the case of employing the frequency modulation, if the duty ratio of a carrier signal is not selected as 1, significant 2nd order harmonics are generated, and the 2nd order harmonics are troublesome where the upper band frequency of the carrier frequency is very close to that of a video band frequency as in the frequency modulator in the VTR.

To avoid this, in the multivibrator of the prior art used as a frequency modulator, a common variable resistor is connected to the two transistors which form the constant current source, the resistor being adjusted to make currents flowing through the respective transistors equal and hence to make the duty ratio 1.

However, the resistor has, in general, an error in the order of ±5 percent in value and also has an error of about ±3 to ±5 percent in value even if it is made as an integrated circuit, so that it is very diffucult to make the duty ratio 1 by adjusting the resistor. Further, since the variable resistor generally can not be formed in an integrated circuit even if the other elements such as the transistors and so on are made as an integrated circuit and must therefore be externally connected to the integrated circuit, the number of terminals of the integrated circuit becomes large.

SUMMARY OF THE INVENTION

Therefore, an object of the present invention is to eliminate the disadvantages of such known circuits and to provide a new and improved multivibrator circuit having a stabilized duty ratio.

Further objects, features and advantages of the present invention will become apparent from the following detailed description of preferred embodiments of the invention.

DESCRIPTION OF THE PREFERRED EMBODIMENTS

Figure 1:
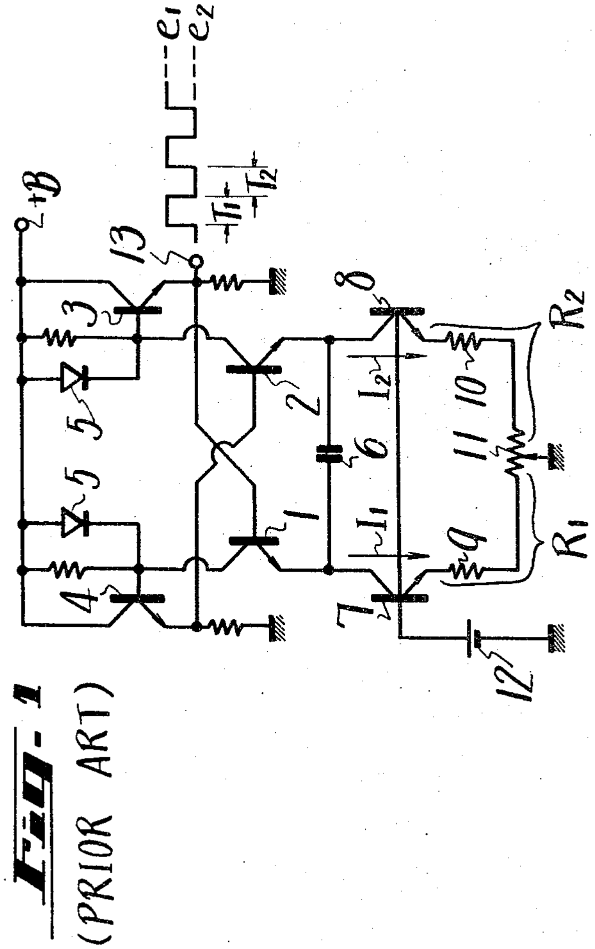
FIG. 1 (PRIOR ART)
FIG. 1 is a schematic circuit diagram showing the prior art.

In order to facilitate a better understanding of the present invention, a frequency modulator of the prior art will be now described with reference to FIG. 1. In the figure, reference numeral 1 designates a transistor the base electrode of which is connected through the emitterbase junction of a transistor 3 to the collector electrode of a transistor 2. Similarly, the base electrode of the transistor 2 is connected through the emitter-base junction of a transistor 4 for impedance matching to the collector electrode of the transistor 1. The collector electrodes of the transistors 1 and 2 are connected to a positive battery source +B through parallel circuits each consisting of a resistor and a diode 5, respectively, while the emitter electrodes of transistors 1 and 2 are connected through a capacitor 6 to each other and to the collector electrodes of transistors 7 and 8, respectively. The emitter electrodes of the transistors 7 and 8 are connected through resistors 9 and 10 and then through a variable resistor 11 to a reference voltage, while the base electrodes of both transistors 7 and 8 are connected to a DC voltage source 12 to form a constant current source. In FIG. 1, reference numeral 13 indicates an output terminal.

With the prior art frequency modulator shown in FIG. 1, if it is assumed that the time interval of an output pulse signal which is of high level $e_1$ at the output terminal 13 led out from the emitter electrode of transistor 3, when the transistor 1 is in its on-state but the transistor 2 is in off-state, is taken as $T_1$ and the time interval of the pulse signal, which is of low level $e_2$ when the transistor 1 is in its off-state and the transistor 2 is in its on-state, is taken as $T_2$, the time intervals $T_1$ and $T_2$ are as follows:

$$T_1 = CV/I_2, \quad T_2 = CV/I_1$$

where $C$ is the capacitance value of the capacitor 6, $V$ the level difference $(e_1 - e_2)$ of the output pulse, $I_1$ a current flowing through the transistor 7, and $I_2$ a current flowing through the transistor 8, respectively.

Further, the currents $I_1$ and $I_2$ are given as follows:

$$I_1 = E - V_{BE7}/R_1, \quad I_2 = E - V_{BE8}/R_2$$

where $R_1$ is the resistance value between the emitter electrode of the transistor 7 and the reference point (ground), $R_2$ the resistance value between the emitter electrode of the transistor 8 and the reference point (ground), $V_{BE7}$ and $V_{BE8}$ the voltages across the respective transistor base-emitter electrodes, and $E$ the voltage applied to the base electrodes of the transistors 7 and 8, respectively.

If the DC voltage source 12 is varied with a modulating signal, the currents $I_1$ and $I_2$ can be varied and hence the time intervals $T_1$ and $T_2$ can be varied to carry out the frequency modulation.

However, during such frequency modulation, in order to make the duty ratio of the carrier signal equal to 1 or to satisfy the expression $T_1 = T_2$, the variable resistor 11 must be adjusted to obtain $R_1 = R_2$ and hence to obtain $I_1 = I_2$, as mentioned above. This adjustment is very difficult to attain.

A fundamental embodiment of the present invention will be now described with reference to FIG. 2 in which the same reference numerals and symbols as those used in FIG. 1 indicate the same elements.

Figure 2:
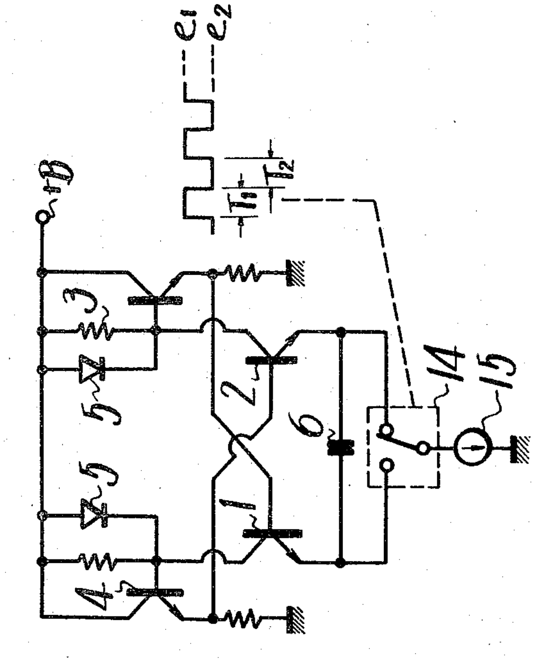
FIG. 2 is a schematic circuit showing a fundamental embodiment in accordance with this invention.

In the embodiment of FIG. 2, the emitter electrodes of the transistors 1 and 2 which form an astable or free-running multivibrator are connected through a switch 14 to a common constant current source 15. The switch 14 is controlled with the output pulse signal derived from the emitter electrode of transistor 3, such that the emitter electrode of one of transistors 1 and 2, the transistor which is in its on-state, is connected through the capacitor 6 to the constant current source 15.

Figure 3:
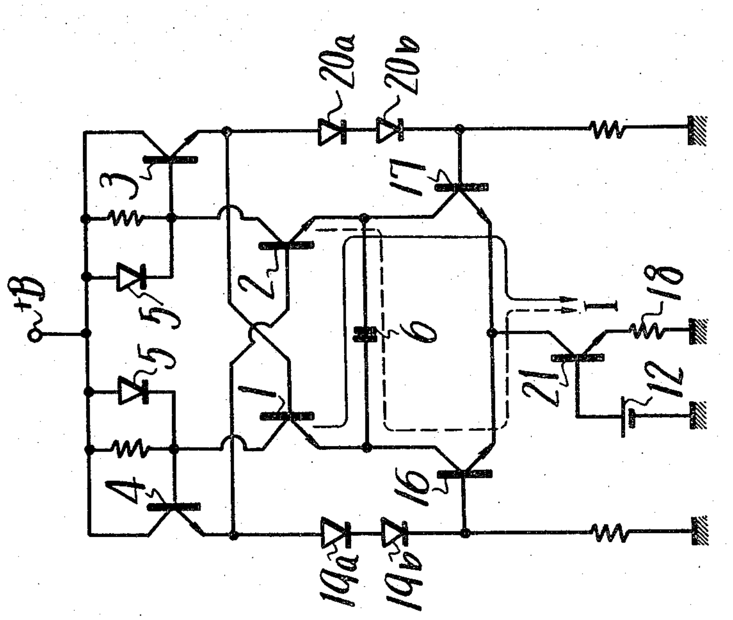
FIG. 3 is a schematic circuit diagram showing a practical embodiment of the present invention.

FIG. 3 shows a practical embodiment of the invention in which the same reference numerals as those used in FIGS. 1 and 2 indicate the same elements.

In the embodiment of FIG. 3, a switching device corresponding to the switch 14 in FIG. 2 is formed of transistors 16 and 17 and the constant current source corresponding to the constant current source 15 in FIG. 2 is formed of a transistor 21, a resistor 18 and the DC voltage source 12. The base electrode of transistor 16 is connected to the emitter electrode of transistor 4 through a series connection of diodes 19a and 19b with the polarity shown in FIG. 3 and is also connected to ground through a resistor, while the base electrode of transistor 17 is connected to the emitter electrode of transistor 3 through a series connection of diodes *20a* and *20b* with the polarity shown in FIG. 2 and is also connected to ground through a resistor. The diodes *19a*, *19b* and *20a*, *20b* are provided to shfit the DC level of transistors 16 and 17, respectively and hence to avoid any deterioration of the switching characteristics of the switching device due to the saturation of transistors 16 and 17. Accordingly, it will be apparent that resistors can be used in place of diodes *19a*, *19b* and *20a*, *20b*, respectively.

With the embodiment of the invention shown in FIG. 3, the output signal which is of high level appears at the emitter electrode of transistor 3 when the transistor 2 is in its off-state, as described previously, while an output signal which is of high level, which is opposite in phase to that at the emitter electrode of transistor 3, appears at the emitter electrode of transistor 4 when the transistor 1 is in its off-state. Accordingly, when the transistor 1 is in its on-state, the transistor 17 is made on with the result that a current I flows through the transistor 1, the capacitor 6 and the transistor 17 as shown in FIG. 3 by a solid line, while when the transistor 2 is in its on-state, the transistor 16 is made on with the result that the current I flows through the transistor 2, the capacitor 6 and the transistor 16 as shown by a dotted line in the figure.

As described above, with the present invention when either one of transistors 1 and 2 is in its on-state, the same current I flows through the capacitor 6 to charge up the same or so that the currents $I_1$ and $I_2$ as in the prior art frequency modulator shown in FIG. 1, become equal to each other, whereby the duty ratio of the output pulse signal can be made 1 inherently.

A further embodiment of the invention will be now described with reference to FIG. 4.

Figure 4:
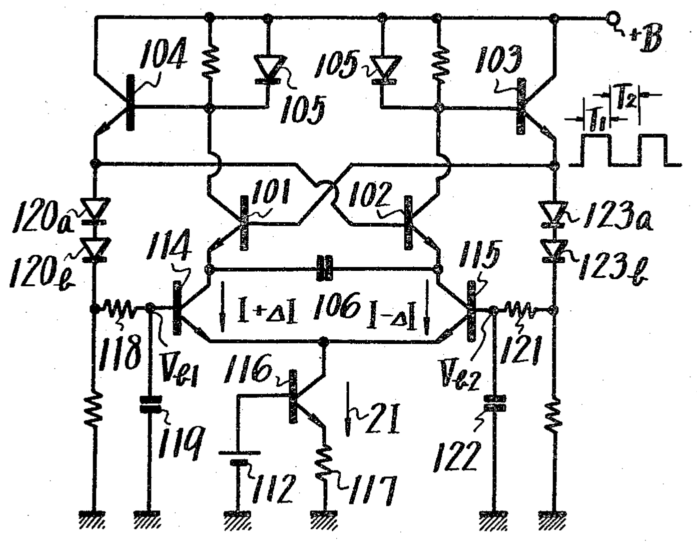
FIG. 4 is a schematic circuit diagram showing another embodiment of the invention.

In the embodiment of FIG. 4, the emitter electrode of a transistor 101 is connected to the collector electrode of a transistor 114, the emitter electrode of a transistor 102 is connected to the collector electrode of a transistor 115, and the emitter electrodes of the transistors 114 and 115 are connected together to a constant current source consisting of a DC voltage source 112, a transistor 116 and a resistor 117. The base electrode of transistor 114 is connected to the emitter electrode of a transistor 104 through a time constant circuit consisting of a resistor 118 and a capacitor 119 and through a series connection of diodes *120a* and 120b with the polarity shown in FIG. 4 and which are used for DC level shift. The connection point between the diode *120b* and the resistor 118 is connected to ground through a resistor. Similarly, a time constant circuit consisting of a resistor 121 and a capacitor 122 and a series connection of diodes *123a* and *123b* with the polarity shown in the figure are inserted between the base electrode of transistor 115 and the emitter electrode of a transistor 103, and the connection point between the resistor 121 and the diode *123b* is connected to ground through a resistor.

Figure 5:
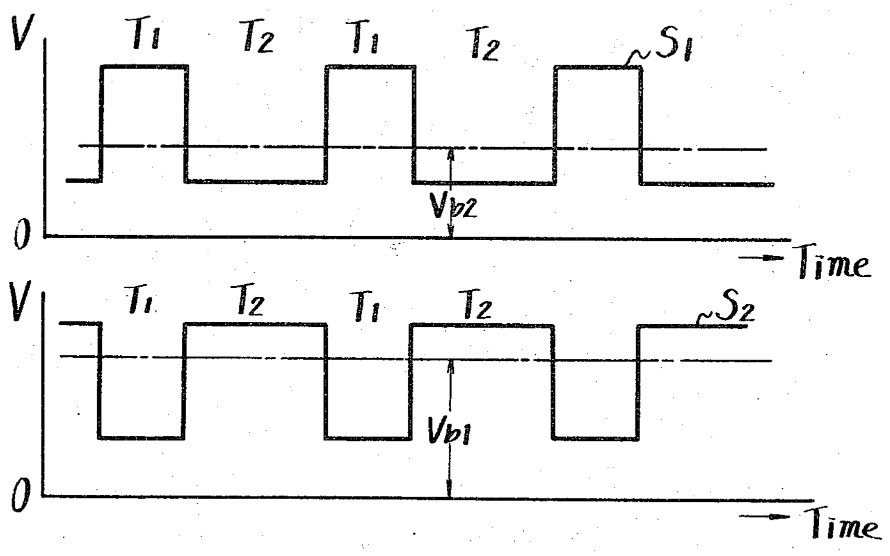
FIG. 5 shows voltage representations at various terminals of the embodiment shown in FIG. 4 when the duty ratio of the output signal is varied.

The operation of the circuit shown in FIG. 4 will be now described with reference to FIG. 5. If the condition $T_1 < T_2$ is satisfied between the time intervals $T_1$ and $T_2$ of a pulse signal $S_1$ appearing at the emitter electrode of transistor 103, by way of example, as shown in FIG. 5, and the output pulse signal $S_2$ which appears at the emitter electrode of transistor 104 is thus opposite in phase to that $S_1$, as shown in FIG. 5, then the DC average potential of the pulse signal $S_1$ which is applied as the base potential $V_{b2}$ of transistor 115 and the DC average potential of the outer other pulse signal $S_2$ which is applied as the base potential $V_{b1}$ of transistor 114 can be shown by the broken lines in FIG. 5 ($V_{b1} > V_{b2}$).

If a current flowing through the constant current source including transistor 116 is taken as 2I, the current flowing through the transistor 114 is higher than that through the transistor 115 by 2ΔI. In other words, the current flowing through the transistor 114 is (I + ΔI) and that through the transistor 115 is (I − ΔI). Accordingly, the transistor 101 is turned on at an earlier time, due to the increase of current flowing through the transistor 114 by ΔI. Thus, the condition $T_1 < T_2$ is capable of being converted to $T_1 = T_2$ if the loop gain of the system is sufficiently great. Conversely, if the condition $T_1 > T_2$ is exhibited by the output pulse signal appearing at the emitter electrode of transistor 103, the condition $V_{b1} < V_{b2}$ obtains and hence the current flowing through the transistor 115 increases to accelerate the turning-on of transistor 102.

In FIG. 4, reference numerals 105 show diodes which correspond to diodes 5 in FIGS. 1–3.

Figure 6:
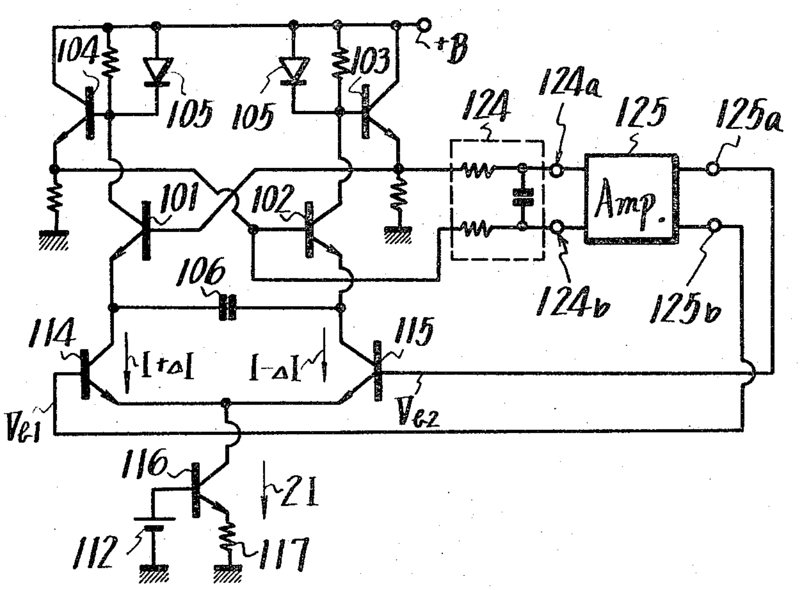
FIG. 6 is a schematic circuit showing another embodiment of the invention.

FIG. 6 shows a further embodiment of the invention in which reference numerals similar to those in FIG. 4 represent similar elements.

In the embodiment of FIG. 6, a time constant circuit 124 is provided for detecting the DC average potentials or voltages of the output pulses which are of opposite polarity and which appear at the emitter electrodes of transistors 103 and 104, respectively. A DC amplifier 125 is provided for detecting the difference between the DC average potentials. If the condition $T_1 < T_2$ is exhibited by the output pulse signal obtained at the emitter electrode of transistor 103, as in the case of FIG. 5, the DC average potential of the output pulse signal decreases at output terminal 124*a* of the time constant circuit 124, but the DC average potential of the other output pulse signal increases at the other output terminal 124*b* of the time constant circuit. The difference between the DC average potentials is produced at output terminals 125*a* and 125*b* of DC amplifier 125 and is fed back to the base electrodes of transistors 114 and 115. In other words, the base potential $V_{b1}$ of transistor 114 is increased further, but the base potential $V_{b2}$ of transistor 115 is decreased, further. Thus, the current flowing through the transistor 114 increases by ΔI, while the current flowing through the transistor 115 decreases by ΔI to make the duty ratio of the output pulse signal 1 ($T_1 = T_2$), as mentioned previously.

Figure 7:
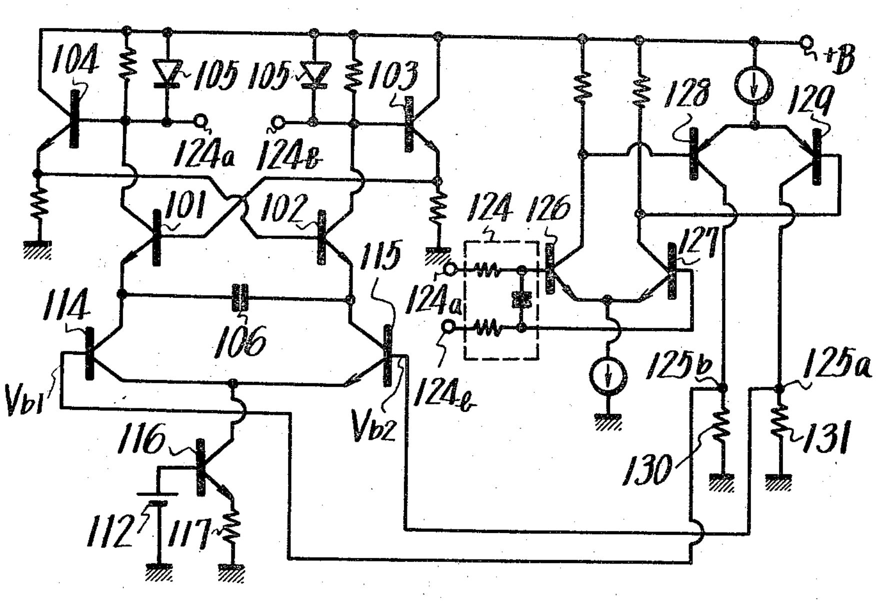
FIG. 7 is a detailed circuit diagram of FIG. 6.

FIG. 7 is a circuit diagram for showing a further embodiment of the invention, wherein a practical embodiment of the DC amplifier 125 shown in FIG. 6 by a block is here shown schematically, and wherein, the other circuit construction is substantially same as that of FIG. 6.

In the embodiment of FIG. 7, the output terminal 124*a* of time constant circuit 124 is connected to the base electrode of transistor 104 and the other output terminal 124*b* is connected to the base electrode of transistor 103. Since the base electrodes of transistors 103 and 104 are in phase with their emitter electrodes, if the condition $T_1 < T_2$ is exhibited by the output pulse signal appearing at the emitter electrode of transistor 103, the DC average potential at the output terminal 124*a* of time constant circuit 124 becomes higher, but the DC average potential at the terminal 124*b* becomes lower. The DC average potential at the terminal 124*a* is applied to the base electrode of a transistor 126, while the DC average potential at the terminal 124*b* is applied to the base electrode of a transistor 127, the transistors 126 and 127 forming a differential amplifier. A level shift circuit consisting of PNP-type transistors 128 and 129 is connected in series to the differential amplifier. The collector electrode of transistor 128 is connected to ground through a resistor 130 and the collector electrode of transistor 129 is connected to ground through a resistor 131. The voltage drops across the resistors 130 and 131 are fed back to the base electrodes of transistors 114 and 115, respectively.

The voltage drop across the resistor 130 provides the base potential $V_{b1}$ of transistor 114 and increases as shown in FIG. 5 by the waveform $S_2$ when the DC average potentials at the terminals 124*a* and 124*b* of time constant circuit 124 vary as mentioned above, while the voltage drop across resistor 131 provides the base potential $V_{b2}$ of transistor 115 and decreases as shown in FIG. 5 by the waveform $S_1$. As a result, the currents flowing through transistors 114 and 115 are controlled and the duty ratio of the output pulse signal appearing at the emitter electrode of transistor 103 is made 1 ($T_1 = T_2$).

The embodiment of the invention shown in FIG. 7 can make the duty ratio 1 as in the embodiment of FIG. 4 and is preferably made as an integrated circuit.

With the embodiment shown in FIG. 4, five diode junctions (diode: 105, transistor 104, diodes 120*a*, 120*b*, transistor 114 or diode 105, transistor 103, diodes 123*a*, 123*b*, transistor 115) are used to detect the DC average potential, and there is some concern that the DC average potential might not be detected correctly if an error occurs in the voltage drops ($V_{BE}$) thereacross. On the contrary, with the embodiment shown in FIG. 7 only two diode junctions (diode 105, transistor 126, or diode 105, transistor 127) are sufficient for detecting the DC average potential, so that correct detection of the DC average potential is obtained.

As may be apparent from the above description, in accordance with the present invention, the duty ratio of output pulse signals can be made 1 inherently and the second order harmonics can be suppressed. Accordingly, if the circuit according to the invention is employed as a frequency modulator of a VTR, problems such as beat-hindrance and so on caused by the second order harmonics can be prevented.

Further, with the invention, no adjustment for duty ratio correction is required and no adjusting means such as a variable resistor and the like are needed. Hence, when the present invention is made as an integrated circuit, the requisite number of terminals to which external parts are connected can be reduced.

With the invention, if the voltage source 12 or 112 is supplied with a modulated signal, a demodulated signal can be obtained at the output terminal such as the emitter electrode of transistor 3 or 103. Accordingly, the circuit according to the present invention can be utilized not only as a frequency modulator but also as a frequency demodulator.

It may be apparent that many modifications and variations could be effected without departing from the spirit or scope of the novel concepts of the present invention.

We claim as our invention:

1. A multivibrator circuit comprising:

first and second transistors each having a base electrode, an emitter electrode and a collector electrode;

voltage supply means;

first and second load elements connecting the respective collector electrodes of said first and second transistors to said voltage supply means, said collector electrodes of said first and second transistors being coupled to said base electrodes of said second and first transistors, respectively;

a capacitor connected between the emitter electrodes of said first and second transistors;

a pair of current controlling devices each having input, output and common electrodes, the output electrodes of said current controlling devices being connected to separate emitter electrodes of said first and second transistors, the common electrodes of said current controlling devices being connected to a constant current source, and said pair of current controlling devices being controlled by the application of said input electrodes of the output signal produced by said first and second transistors, whereby said emitter electrodes of said first and second transistors are alternately connected to said constant current source through said current controlling devices to provide a constant duty ratio.

2. A multivibrator circuit as claimed in claim 1, wherein said first and second load elements each includes a supplemental transistor having a base electrode, an emitter electrode and a collector electrode, said collector electrodes of said first and second transistors being coupled to said base electrodes of said second and first transistors by said base-emitter junctions of said supplemental transistors, respectively.

3. A multivibrator circuit as claimed in claim 1, wherein each of said current controlling devices is a switching element having conducting and non-conducting states, said switching elements being alternately switched between respective states by the output signals produced by said first and second transistors.

4. A multivibrator circuit as claimed in claim 1, wherein each of said current controlling devices comprises a variable impedance element, and said multivibrator further includes time constant circuits connected to the input electrodes of said variable impedance elements and being supplied with respective output signals produced by said first and second transistors, whereby the impedance of said impedance elements is controlled by the DC average voltage of the output signals produced by said first and second transistors.

5. A multivibrator circuit as claimed in claim 4, further including a DC amplifier connected between said time constant circuits and the input electrodes of said variable impedance elements.

6. A multivibrator circuit as claimed in claim 5, wherein said DC amplifier comprises a differential amplifier.

7. A multivibrator circuit as claimed in claim 1, wherein said constant current source is a variable impedance device.

8. A multivibrator circuit as claimed in claim 7, wherein said variable impedance device is a transistor having base, emitter and collector electrodes.

9. A multivibrator circuit as claimed in claim 7, wherein the impedance of said variable impedance device is varied by a modulating signal applied thereto so that a modulated signal is produced at an output of said multivibrator circuit.

10. A multivibrator circuit as claimed in claim 7, wherein the impedance of said variable impedance device is varied by a modulated signal applied thereto so that a demodulated signal is produced at an output of said multivibrator circuit.

* * * * *